US009472570B2

(12) United States Patent
Botula et al.

(10) Patent No.: US 9,472,570 B2
(45) Date of Patent: Oct. 18, 2016

(54) DIODE BIASED BODY CONTACTED TRANSISTOR

(71) Applicant: INTERNATIONAL BUSINESS MACHINES CORPORATION, Armonk, NY (US)

(72) Inventors: Alan B. Botula, Essex Junction, VT (US); Randy L. Wolf, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 16 days.

(21) Appl. No.: 14/182,459

(22) Filed: Feb. 18, 2014

(65) Prior Publication Data

US 2015/0236040 A1 Aug. 20, 2015

(51) Int. Cl.
| | | |
|---|---|---|
| *H01L 27/12* | (2006.01) | |
| *H01L 27/06* | (2006.01) | |
| *H01L 29/66* | (2006.01) | |
| *H01L 21/768* | (2006.01) | |
| *H01L 21/84* | (2006.01) | |
| *H01L 23/528* | (2006.01) | |
| *H01L 27/07* | (2006.01) | |
| *H01L 29/861* | (2006.01) | |
| *H01L 29/423* | (2006.01) | |

(52) U.S. Cl.
CPC ......... *H01L 27/1203* (2013.01); *H01L 21/768* (2013.01); *H01L 21/84* (2013.01); *H01L 23/528* (2013.01); *H01L 27/0629* (2013.01); *H01L 27/0727* (2013.01); *H01L 29/66568* (2013.01); *H01L 29/42372* (2013.01); *H01L 29/66136* (2013.01); *H01L 29/861* (2013.01); *H01L 2924/0002* (2013.01)

(58) Field of Classification Search
CPC .................. H01L 29/78615; H01L 29/42316; H01L 29/42376; H01L 21/28114; H01L 21/28587; H01L 29/42384; H01L 27/1203; H01L 27/66545; H01L 29/8128; H01L 2924/1306; H01L 21/74; H01L 21/823456; H01L 21/82385; H01L 51/0541; H01L 51/055; H01L 27/0207; H01L 29/42372; H01L 27/14614; H01L 27/0629; H01L 27/0727; H01L 21/768; H01L 21/84; H01L 23/528; H01L 29/66568
See application file for complete search history.

(56) References Cited

U.S. PATENT DOCUMENTS

| | | | | |
|---|---|---|---|---|
| 3,986,903 | A * | 10/1976 | Watrous, Jr. ............ | H01L 21/00 148/DIG. 133 |
| 4,148,046 | A * | 4/1979 | Hendrickson ....... | H01L 29/0692 257/401 |
| 4,672,403 | A * | 6/1987 | Jennings ............... | H01L 29/866 257/605 |
| 5,219,783 | A * | 6/1993 | Moslehi .................. | H01L 21/22 257/E21.038 |
| 5,412,527 | A * | 5/1995 | Husher ............... | H01L 27/0255 361/111 |
| 5,610,790 | A * | 3/1997 | Staab .................. | H01L 27/0255 361/111 |
| 5,736,779 | A * | 4/1998 | Kobayashi .......... | H01L 27/0255 257/355 |
| 6,057,726 | A * | 5/2000 | Sumida ................. | H03F 3/3001 326/68 |
| 6,509,234 | B1 * | 1/2003 | Krivokapic ....... | H01L 29/42384 257/E21.415 |

(Continued)

*Primary Examiner* — Allen Parker
*Assistant Examiner* — Gustavo Ramallo
(74) *Attorney, Agent, or Firm* — Michael LeStrange; Andrew M. Calderon; Roberts Mlotkowski Safran Cole & Calderon, P.C.

(57) ABSTRACT

Approaches for body contacted transistors are provided. A method of manufacturing a semiconductor structure includes forming a field effect transistor (FET) including a channel and a gate. The method also includes forming a diode that is electrically connected between the channel and the gate, wherein the diode and channel are contained in a same layer of material.

19 Claims, 5 Drawing Sheets

(56) References Cited

U.S. PATENT DOCUMENTS

| | | |
|---|---|---|
| 6,521,948 B2 | 2/2003 | Ebina |
| 6,524,937 B1 * | 2/2003 | Cheng ............... H01L 21/28581 257/E21.173 |
| 6,566,708 B1 * | 5/2003 | Grover .................. H01L 29/402 257/135 |
| 7,683,433 B2 | 3/2010 | Kapoor et al. |
| 7,728,350 B2 * | 6/2010 | Bhattacharyya ........ G11C 11/40 257/154 |
| 7,968,402 B2 | 6/2011 | Bhattacharyya |
| 8,048,732 B2 | 11/2011 | Kapoor et al. |
| 8,125,003 B2 | 2/2012 | Bhattacharyya |
| 8,704,578 B2 * | 4/2014 | Kurokawa .......... H01L 27/0285 327/309 |
| 2002/0063296 A1 * | 5/2002 | Kitagawa ............ H01L 27/0629 257/369 |
| 2005/0128803 A1 * | 6/2005 | Luk ....................... G11C 11/405 365/175 |
| 2005/0161740 A1 * | 7/2005 | Park .................... H01L 27/3253 257/347 |
| 2005/0275065 A1 * | 12/2005 | Cogan .................. H01L 29/866 257/603 |
| 2007/0018247 A1 * | 1/2007 | Brindle ............. H01L 29/78609 257/347 |
| 2010/0012974 A1 * | 1/2010 | Shih ...................... H01L 31/028 257/185 |
| 2010/0065851 A1 * | 3/2010 | Makita .................... H01L 27/12 257/72 |
| 2011/0169550 A1 | 7/2011 | Brindle et al. |
| 2011/0198608 A1 * | 8/2011 | Yamanaka ............. G02F 1/1368 257/72 |
| 2011/0273390 A1 * | 11/2011 | Nakatsuji ............. G06F 3/0412 345/173 |
| 2012/0068182 A1 * | 3/2012 | Yamanaka ........... H01L 21/268 257/59 |
| 2012/0139004 A1 | 6/2012 | Bhattacharyya |
| 2013/0015498 A1 | 1/2013 | Briere |
| 2013/0015499 A1 | 1/2013 | Briere |
| 2013/0026573 A1 | 1/2013 | Wu et al. |

* cited by examiner

US 9,472,570 B2

DIODE BIASED BODY CONTACTED TRANSISTOR

FIELD OF THE INVENTION

The invention relates to integrated circuits and, more particularly, to a body contacted transistor and methods of manufacture.

BACKGROUND

In a typical silicon-on-insulator (SOI) transistor, the body is generally isolated from the silicon substrate and usually kept floating. This may result in problems for current-sensitive circuit applications, since the body typically retains charge from the previous time the transistor was utilized. The retained charge within the body interferes with subsequent use of the device. A variety of solutions have been proposed to address the problems associated with the SOI semiconductor device. For example, the use of a body contact in the SOI device addresses this problem, and also allows the threshold voltage to be changed so that standby power can be reduced for low-power applications. The body contact in the SOI device has conventionally been made by the use of a T-shaped or a H-shaped polysilicon structure on an active area, thereby creating three distinct regions including a source region, a drain region, and a body contact region. Body voltage control in field effect transistors (FETs) is used to control the threshold voltage, reduce the parasitic bipolar effect in partially depleted silicon-on-insulator (SOI) FETs, and improve linearity of the device. Alternating current (AC) feedback loops can also provide an advantage in linearity by having the FET respond faster to changing conditions.

SUMMARY

In a first aspect of the invention, there is a method of forming a semiconductor structure. The method includes forming a field effect transistor (FET) including a channel and a gate. The method also includes forming a diode that is electrically connected between the channel and the gate, wherein the diode and channel are contained in a same layer of material.

In another aspect of the invention, there is a method of manufacturing a semiconductor structure. The method includes: forming a p-doped island in a silicon-on-insulator wafer; forming a gate of a field effect transistor (FET) on the island, wherein the gate is formed with a crossbar and a leg; and forming a bar on the island, wherein the bar is formed laterally offset from the crossbar. The method also includes: forming a p+ doped anode in the island between the bar and the crossbar; forming a n+ doped cathode in the island on a side of the bar opposite the crossbar; and forming contacts and an interconnect that electrically connect the cathode to the gate. The anode and the cathode are parts of a p+/p/n+ diode that is electrically connected between a channel of the FET and the gate of the FET.

In another aspect of the invention, a semiconductor structure includes a substrate, a buried insulator layer on the substrate, and a layer of semiconductor material on the buried insulator layer. The semiconductor structure also includes a field effect transistor (FET) including a gate on the layer of semiconductor material and a channel in the layer of semiconductor material. The semiconductor structure additionally includes a diode in the layer of semiconductor material. The semiconductor structure further includes contacts and an interconnect that electrically connect the diode to the gate.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a body contacted transistor which comprises the structures of the present invention. In still further embodiments, a method in a computer-aided design system is provided for generating a functional design model of a body contacted transistor. The method comprises generating a functional representation of the structural elements of the body contacted transistor.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to a body contacted transistor and methods of manufacture. According to aspects of the invention, a diode is connected between a body and a gate of a body contacted FET. Biasing the body with a diode as described herein permits using the gate connection to control the body to take advantage of controlling the threshold voltage, reducing the parasitic bipolar effect, and improving linearity. In embodiments, the diode comprises a p/p+/p/n+ structure formed in a same layer of material as the body, channel, source, and drain of the FET.

In additional aspects, the diode is integrated with a FET parameterized cell (p-cell) to reduce body area and provide better model scaling from test sites and diode distribution across the FET body. This p-cell integrates a more uniform distribution of the diode to a FET body. This p-cell also removes external contacts and wiring required to connect diode to body which results in area savings and removal of wire parasitic capacitance. This p-cell additionally reduces overall parasitic capacitance between each device to substrate. This p-cell provides near removal of phase shifting between the two devices associated with placement location of two separate devices which often leads to undesirable interference distortion. This p-cell also provides more accurate modeling having scalability control of the p-cell, and eliminates separate gate and body voltage control.

Figure 1:
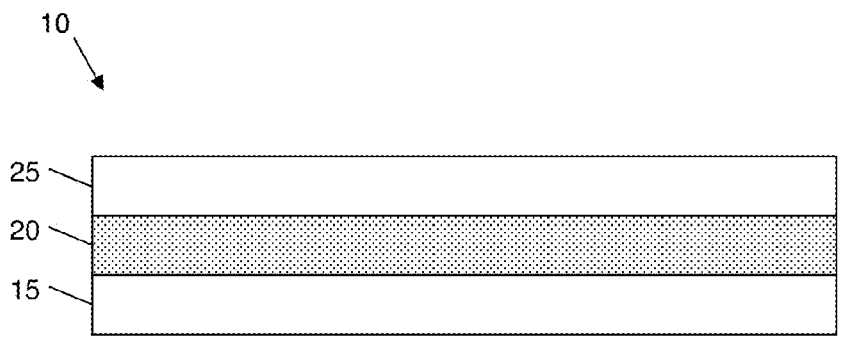
FIGS. 1, 2a-b, 3a-b, 4a-b, 5a-b, 6a-b, and 7a-b show views of structures and respective processing steps in accordance with aspects of the invention.

FIGS. 1-7b show processing steps and respective structures in accordance with aspects of the invention. Specifically, FIG. 1 shows an exemplary SOI wafer 10 employed as an intermediate structure in implementations of the invention. The SOI wafer 10 has a bulk semiconductor substrate 15, which is typically a bulk silicon substrate, a buried insulator layer 20 formed on the substrate 15, and a semiconductor layer 25, which is typically a silicon layer formed on the buried insulator layer 20. The SOI wafer 10 may be fabricated using techniques understood by those skilled in the art. For example, the SOI wafer 10 may be formed by conventional processes including, but not limited to, oxygen implantation (e.g., SIMOX), wafer bonding, etc.

The constituent materials of the SOI wafer 10 may be selected based on the desired end use application of the semiconductor device. For example, the substrate 15 may be composed of any suitable material including, but not limited to, Si, SiGe, SiGeC, SiC, GE alloys, GaAs, InAs, InP, and other III/V or II/VI compound semiconductors. The buried insulator layer 20 may be composed of oxide, such as $SiO_2$, and may be referred to as a buried oxide (BOX) layer 20. Moreover, although the SOI wafer is referred to as "silicon on insulator," the semiconductor layer 25 is not limited to silicon. Instead, the semiconductor layer 25 may be comprised of various semiconductor materials, such as, for example, Si, SiGe, SiC, SiGeC, etc.

In aspects of the invention, the semiconductor layer 25 comprises a semiconductor material (e.g., silicon, etc.) that is lightly doped with p-type impurity such as boron, indium, gallium, etc. The lightly doped material is designated as "p". The doping may be achieved in any suitable manner.

In embodiments, the SOI wafer 10 has a thickness of about 700 μm, with the BOX layer 20 having a thickness in a range of about 0.4 μm to about 1 μm, and the semiconductor layer 25 having a thickness in a range of about 0.1 μm to about 0.2 μm, and more particularly about 0.145 μm. However, the invention is not limited to these dimensions, and the various portions of the SOI wafer may have any desired thicknesses based upon the intended use of the final semiconductor device.

Figure 2A:
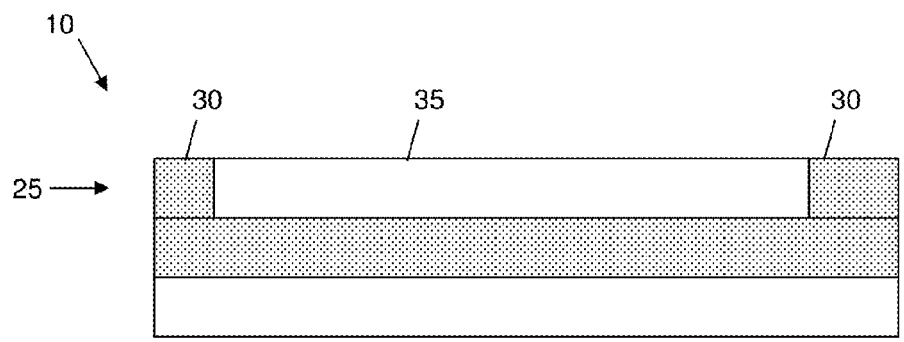
Figure 2B:
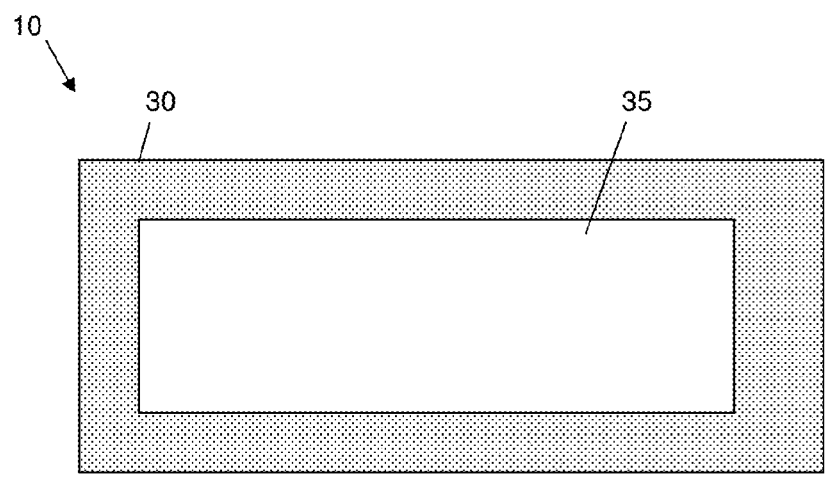

As shown in FIG. 2a, a shallow trench isolation (STI) structure 30 is formed in the wafer 10. The STI 30 may be conventional shallow trench isolation structures formed using conventional semiconductor fabrication processes and materials. For example, the STI 30 may be formed by arranging a photoresist material on the semiconductor layer 25, exposing and developing the photoresist, etching an STI trench in the semiconductor layer 25 through the patterned photoresist (e.g., using a reactive ion etch (RIE) process), stripping the photoresist, filling the trench with an STI material (e.g., $SiO_2$), and planarizing the top surface of the structure (e.g., via chemical mechanical polish (CMP)). The STI 30 locally replaces a portion of the semiconductor layer 25. As shown in FIG. 2b, which is a plan view of FIG. 2a, the remaining portion of the semiconductor layer 25 that is surrounded by the STI 30 is referred to as an island 35.

Figure 3A:
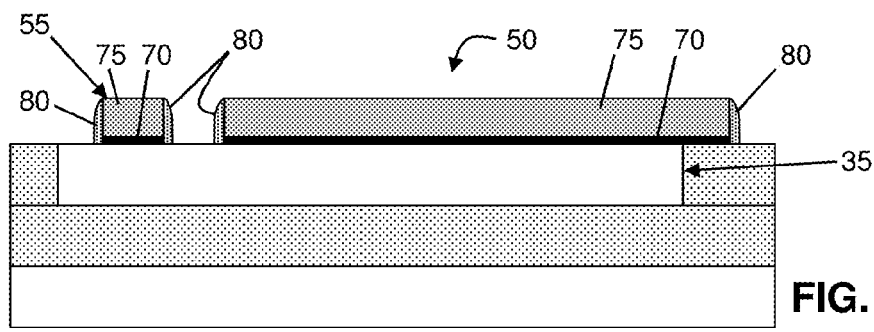
Figure 3B:
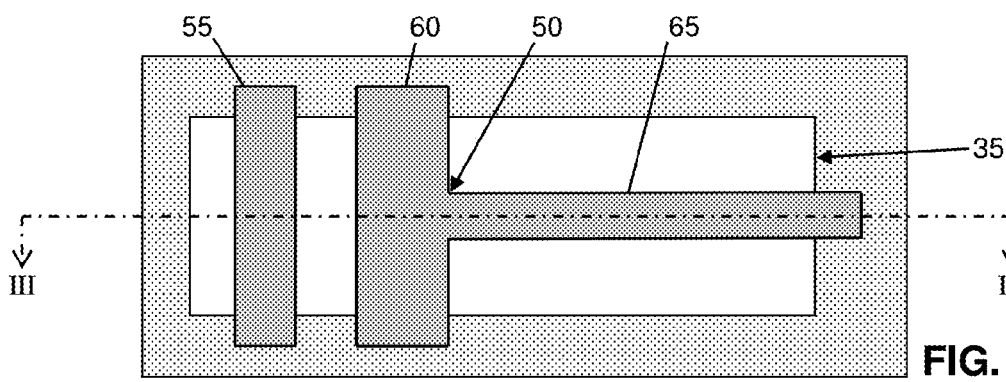

FIGS. 3a and 3b show a cross section and plan view of the structure after forming a gate 50 and a bar 55 on the island 35. FIG. 3a is a cross section along line III-III of FIG. 3b. In embodiments, the gate 50 comprises a T-shaped gate including a crossbar 60 and a leg 65. In aspects, in the plan view as depicted in FIG. 3b, the leg 65 is substantially orthogonal to the crossbar 60 and the bar 55 is substantially parallel to and laterally offset from the crossbar 60. The gate 50 and bar 55 may be formed using conventional complementary metal oxide semiconductor (CMOS) manufacturing processes and materials. For example, the gate 50 and bar 55 may be formed by: depositing gate insulator material 70 and polysilicon 75 on the island 35, e.g., using chemical vapor deposition (CVD) or the like; patterning the insulator material 70 and polysilicon 75 into the shape of the bar 55, crossbar 60, and leg 65, e.g., using photolithographic masking and etching; and forming sidewall spacers 80, e.g., using deposition and etching processes. The sidewall spacers 80 are omitted from view in FIG. 3b and other plan views for clarity.

Figure 4A:
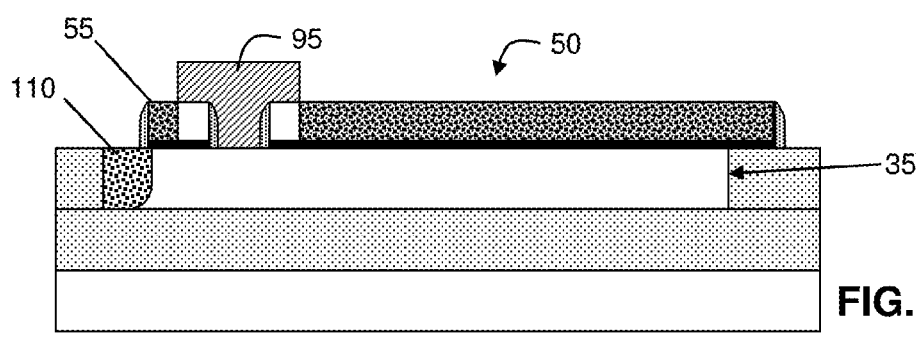
Figure 4B:
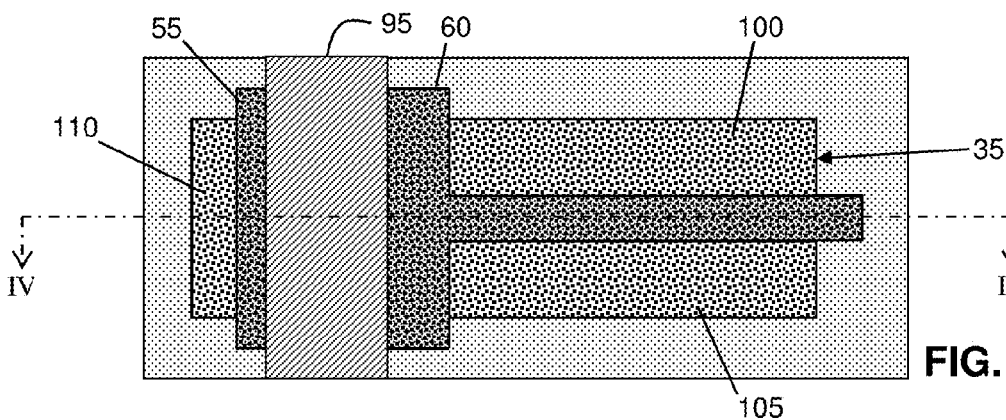

FIGS. 4a and 4b are a cross section and plan view of the structure, with FIG. 4a being a cross section taken along line IV-IV of FIG. 4b. In embodiments, a mask 95 is formed over a portion of the island 35 that extends between the bar 55 and the crossbar 60. After forming the mask 95, the unmasked portions of the island 35 are doped with an n-type impurity to form an n+ doped source region 100, n+ drain region 105, and n+ cathode region 110 in the island 35.

The mask 95 may be formed using conventional semiconductor manufacturing processes. For example, the mask 95 may comprise a photomask that is formed by depositing a photoresist material over the entire structure, exposing the photoresist material using a pattern of light, and developing the photoresist material to remove some portions of the photoresist material while leaving in place other portions of the photoresist material. The mask 95 may cover portions of the gate 50 and the bar 55 as depicted in FIGS. 4a and 4b.

The doping of the source region 100, drain region 105, and cathode region 110 may be accomplished using conventional semiconductor manufacturing processes. For example, after forming the mask 95, an ion implant process may be used to implant an n-type impurity such as phosphorous, arsenic, antimony, bismuth, etc., into the unmasked portions of the island 35. The ion implant process may be controlled such that the doped regions, i.e., the source region 100, drain region 105, and cathode region 110 are heavily doped with the n-type impurity. As used herein, lightly doped and heavily doped are relative terms, with heavily doped regions having a concentration about 50 to 100 times that of lightly doped regions.

Still referring to FIGS. 4a and 4b, in aspects, the cathode region 110 is in the island 35 on a side of the bar 55 opposite the crossbar 60. Also, the source region 100 and drain region 105 are in the island 35 on a side of the crossbar 60 opposite the bar 55. A region of the island 35 underneath the gate 50 is masked by the gate 50 during the ion implant, such that this region remains p-type semiconductor material (e.g., silicon). Similarly, a region of the island 35 underneath the bar 55 is masked by the bar 55 during the ion implant, such that this region remains p-type semiconductor material (e.g., silicon). Portions of the polysilicon of the gate 50 and bar 55 that are unmasked during the ion implant are doped with the n-type impurity. The mask 95 is removed after forming the source region 100, drain region 105, and cathode region 110.

Figure 5A:
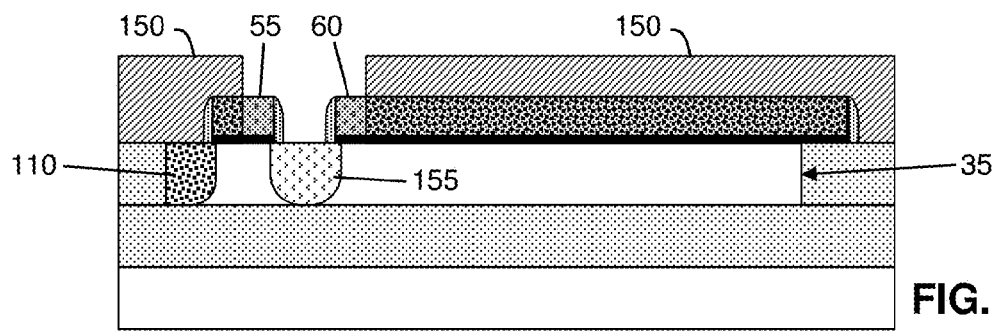
Figure 5B:
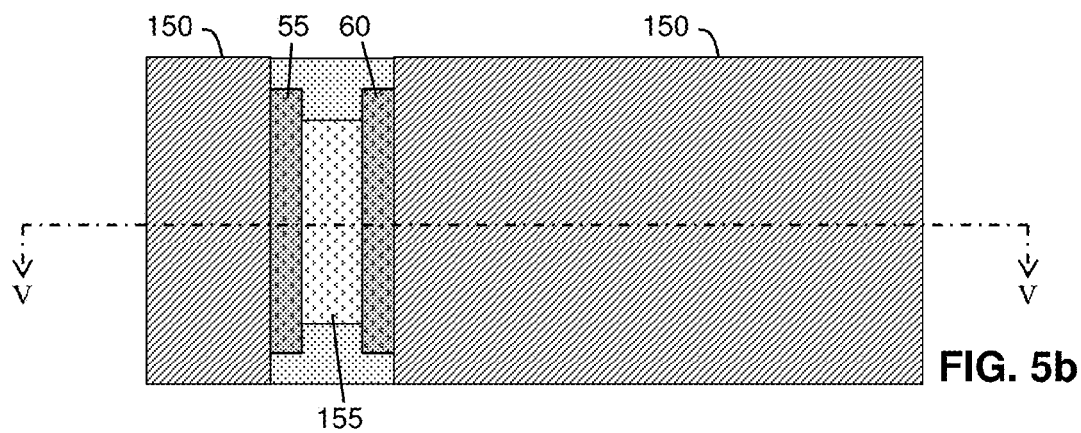

FIGS. 5a and 5b are a cross section and plan view of the structure, with FIG. 5a being a cross section taken along line V-V of FIG. 5b. In embodiments, a mask 150 is formed over the source region, drain region, and cathode region 110, while leaving the portion of the island 35 between the bar 55 and crossbar 60 unmasked. After forming the mask 150, the unmasked portion of the island 35 is doped with a p-type impurity to form a p+ doped body/anode region 155 in the island 35.

The mask 150 may be formed using conventional semiconductor manufacturing processes, such as a photomask. The doping of the body/anode region 155 may be accomplished using conventional semiconductor manufacturing processes. For example, after forming the mask 150, an ion implant process may be used to implant a p-type impurity such as boron, indium, gallium, etc., into the unmasked portions of the island 35. The ion implant process may be controlled such that the body/anode region 155 is heavily doped with the p-type impurity.

With continued reference to FIGS. 5a and 5b, in aspects, the mask 150 covers less than an entirety of the bar 55 and crossbar 60, and the mask 150 leaves the body/anode region 155 in the island 35 between the bar 55 opposite the crossbar 60 uncovered. In this manner, the body/anode region 155 and portions of the polysilicon of the bar 55 and crossbar 60 are heavily doped with the p-type impurity during the ion implant. A region of the island 35 underneath the gate crossbar 60 is masked by the crossbar 60 during the ion implant, such that this region remains lightly doped p-type semiconductor material (e.g., silicon). Similarly, a region of the island 35 underneath the bar 55 is masked by the bar 55 during the ion implant, such that this region remains lightly doped p-type semiconductor material (e.g., silicon). The mask 150 is removed after the ion implant that forms body/anode region 155. The p-type dopant used in the implant of body/anode region 155 may be the same p-type dopant used in the island 35, or may be a different p-type dopant.

Figure 6A:
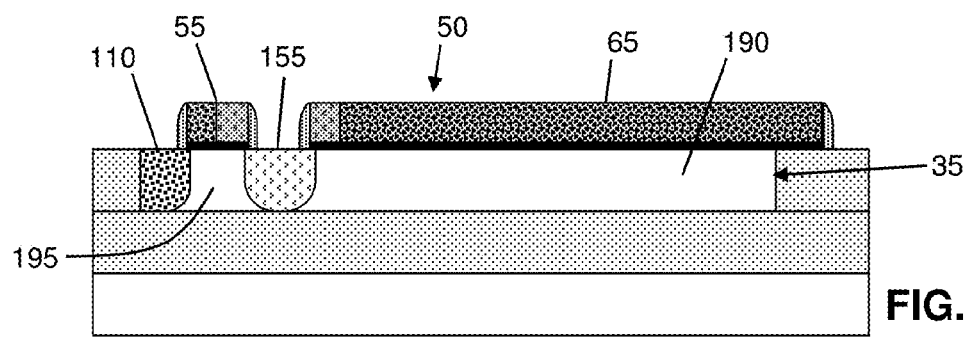
Figure 6B:
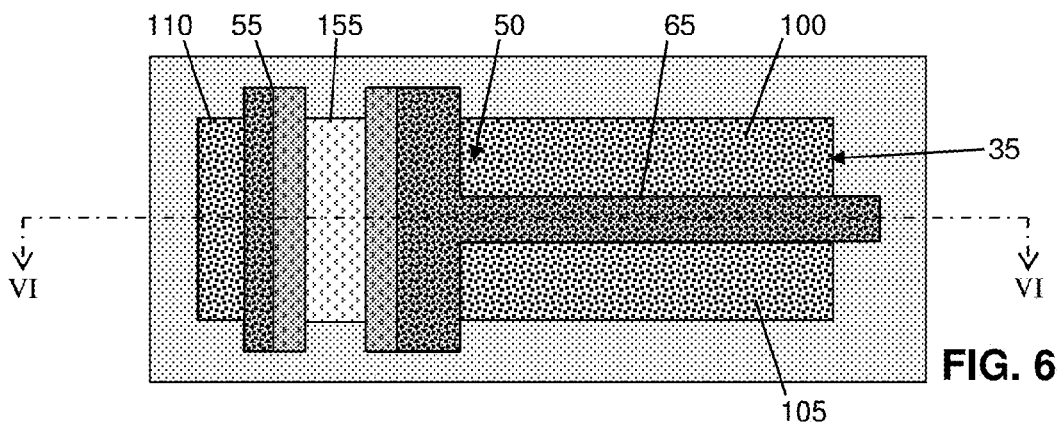

FIGS. 6a and 6b are a cross section and plan view of the structure after removing the mask that was used in forming p+ body/anode region 155. FIG. 6a is a cross section along line VI-VI of FIG. 6b. According to aspects of the invention, the structure includes an n+ source region 100, n+ drain region 105, n+ cathode region 110, and a p+ body/anode region 155. The structure also includes a p-type channel region 190 in the island 35 underneath the leg 65 of the gate 50 and between the n+ source region 100 and the n+ drain region 105. The structure further includes a p-type region 195 in the island 35 underneath the bar 55 and between the n+ cathode region 110 and the p+ body/anode region 155. In this manner, a compound p/p+/p/n+ junction is formed by the channel region 190, body/anode region 155, region 195, and cathode region 110, respectively.

Figure 7A:
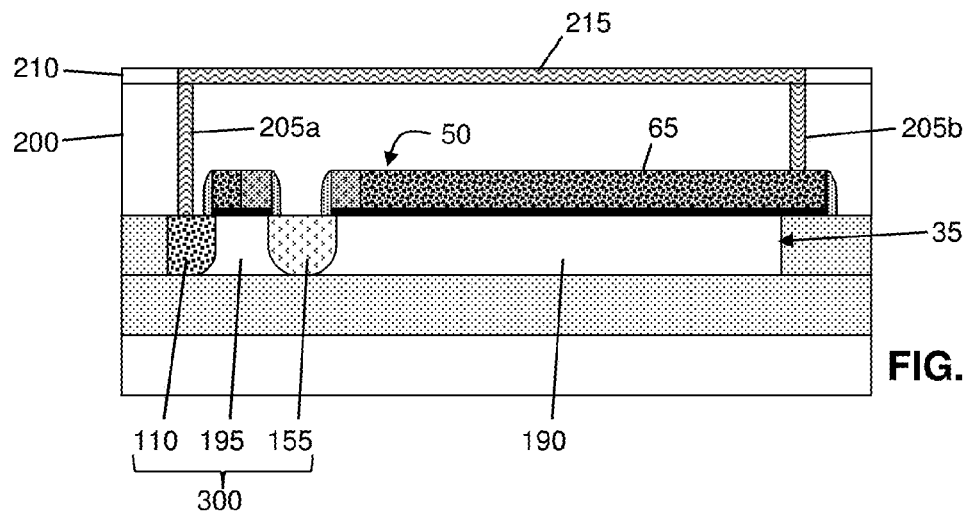
Figure 7B:
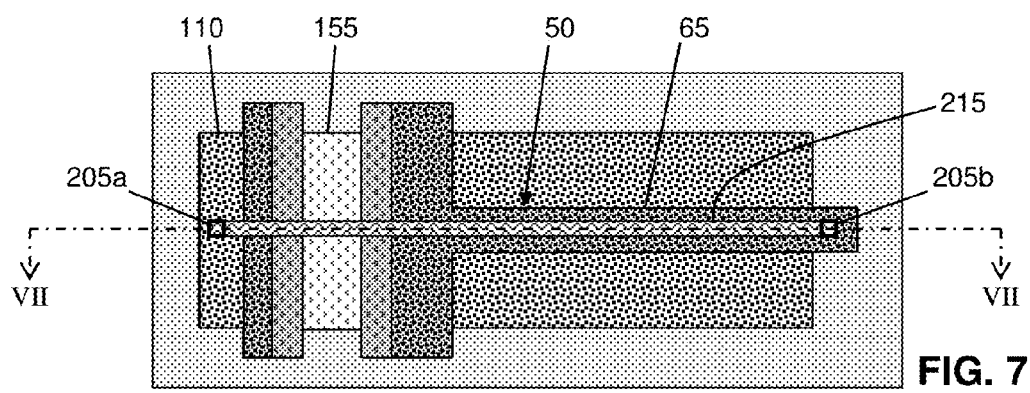

FIGS. 7a and 7b are a cross section and plan view of the structure, with FIG. 7a being a cross section along line VII-VII of FIG. 7b. In particular, FIG. 7a depicts forming an insulator layer 200 on the structure and forming electrical contacts 205a-b in the insulator layer 200. The insulator layer 200 and electrical contacts 205a-b may be formed using conventional CMOS processes and materials. For example, the insulator layer 200 may be formed by depositing an oxide (e.g., SiO$_2$ via CVD) over the entire top surface of the structure. The electrical contacts 205a-b may be formed by forming a photomask on the insulator layer 200, etching holes in the insulator layer 200 through the photomask, stripping the photomask, filling the holes with an electrically conductive material (e.g., copper, aluminum, etc.) using CVD, and planarizing the top surface of the resulting structure, e.g., using chemical mechanical polish (CMP). FIG. 7a further depicts forming another insulator layer 210 and a metal layer 215 (e.g., an interconnect, wire, etc.) on the insulator layer 200 and electrical contacts 205a-b. The insulator layer 210 and metal layer 215 may be formed in the same manner as insulator layer 200 and electrical contacts 205a-b, e.g., using appropriate deposition, masking, etching, and planarizing steps.

Referring to FIGS. 7a and 7b, in embodiments contact 205a is formed on and contacting cathode region 110, and contact 205b is formed on and contacting the leg 65 of the gate 50. In aspects, metal layer 215 is formed on and contacting each of the contacts 205a and 205b. In this manner, the contacts 205a-b and metal layer 215 form an electrically conductive path between the cathode region 110 and the gate 50. The cathode region 110 is also part of a p+/p/n+ diode 300 formed by the body/anode region 155, region 195, and cathode region 110. In implementations, the structure thus includes a body contacted nFET in which a diode 300 is included in a path that connects a channel of the nFET to a gate of the nFET. In aspects, the p+ portion of the diode 300 does not directly contact the n+ portion of the diode 300. In additional aspects, the diode 300 is formed and completely contained in the same layer of material as the channel 190 of the FET, i.e., both are formed in the same island 35 of semiconductor material.

Figure 8:
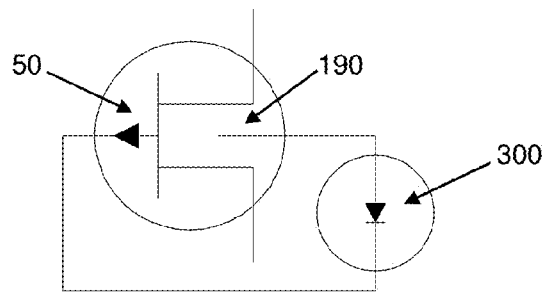
FIG. 8 shows a circuit diagram in accordance with aspects of the invention.

FIG. 8 shows a circuit diagram of the structure of FIGS. 7a and 7b. As depicted in FIG. 8, the diode 300 connects the channel region 190 to the gate 50.

With reference to FIGS. 1-8, in an aspect of the invention there is a semiconductor structure comprising a semiconductor diode integrated with a FET device in a Silicon-on-Insulator (SOI) manufacturing process. In embodiments, the semiconductor structure includes: a silicon substrate 15; a first buried oxide layer 20 deposited on the substrate 15; and a first layer 35 of p doped silicon deposited on the first buried oxide layer 20. In aspects, the semiconductor structure includes a first polysilicon region deposited on the first layer 35 of p doped silicon, the first polysilicon region forming a T-shaped gate structure 50 having a first finger region 65 extending orthogonally from a first side of the T-shaped gate structure 50 to form a conductive channel for the FET device. In aspects, the semiconductor structure includes a second polysilicon region 55 deposited on the surface of the first layer 35 of p doped silicon, the second polysilicon region 55 laterally displaced from and running parallel to a second side of the T-shaped gate structure 50. In aspects, the semiconductor structure includes a first n+ doped diffusion region 110 implanted in the first layer 35 of p doped silicon outside a lateral boundary of the first and second polysilicon regions. In aspects, the semiconductor structure includes a first p+ doped region 155 implanted in the first layer 35 of the p doped silicon between the first polysilicon region and the second polysilicon region. In aspects, the semiconductor structure includes a compound p+/p/n+ junction formed by the respective p, p+ and n+ implants, such that an anode contact of the diode 300 is formed in the first p+ doped region and a cathode contact of the diode 300 is formed within a portion of the n+ doped diffusion region abutting the p doped silicon layer under the second polysilicon region.

Implementations of the invention may be used to integrate a more uniform distribution of the diode with the body of a FET. In embodiments, the shared diode terminal is a single doped region of silicon directly adjacent to and electrically part of the FET body region and serves as one of the p-n junction terminals of the diode. In aspects, the merged diode shared region is spaced less than 0.5 μm such that the phase between two devices is less than 0.5 μm/λ (−0.005° for 2.5 GHz), which is an improvement over the placement location of two separate devices in which the phase shift from one end of a switch FET to the other is 0.013° to 5° for 2.5 GHz operation. Placement location of two separate devices results in unequal phase distribution that depends on the FET total number of gate fingers that is required to achieve the total gate width. This can be expressed by the given equation: Phase=d/λ where d=(spacing from drain to source)*(number of gate fingers). As a result, implementations of the invention may be used to achieve area savings, more accurate modeling having scalability control of a p-cell, and to eliminate separate control of gate and body.

Figure 9:
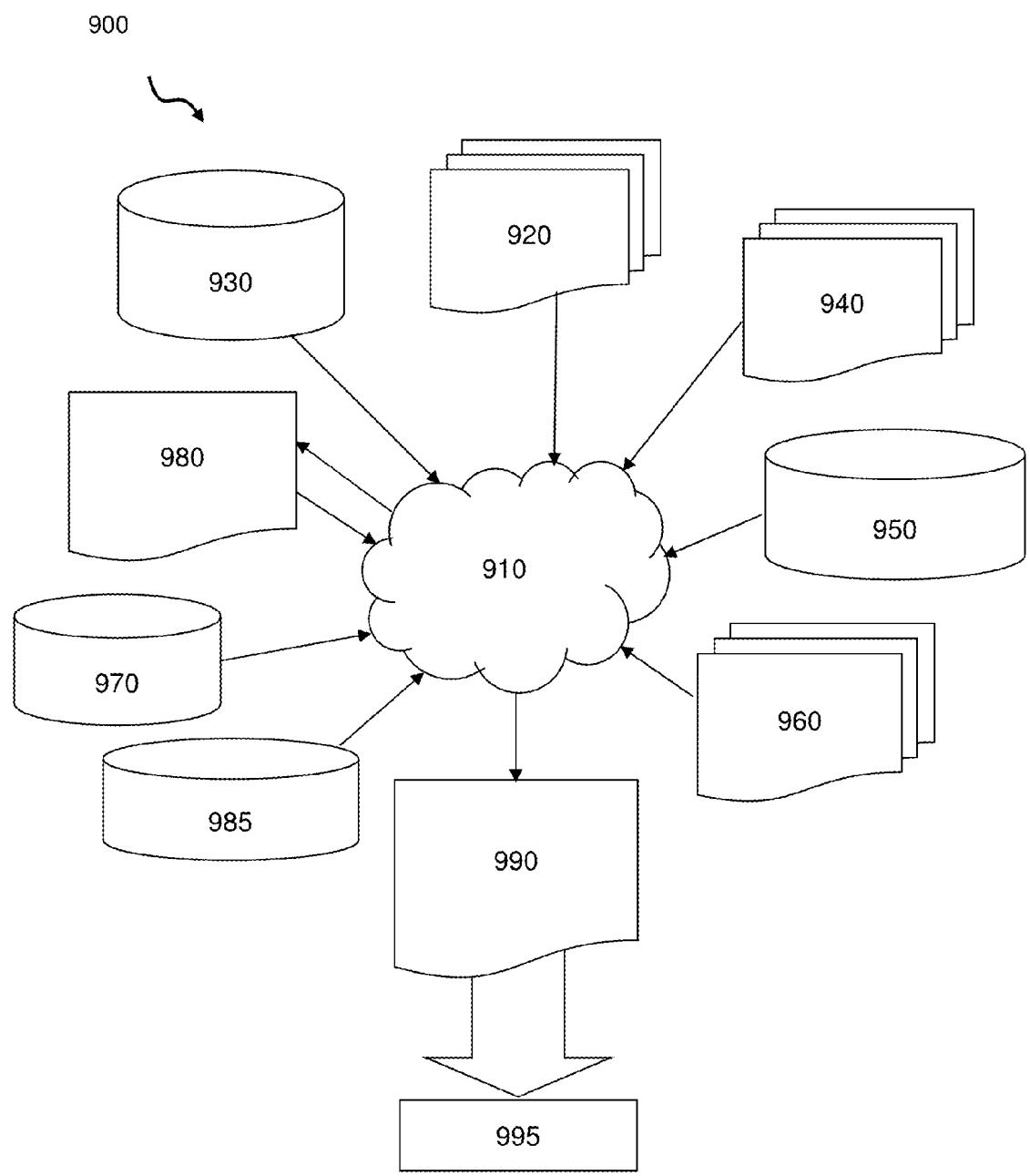
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2a-b, 3a-b, 4a-b, 5a-b, 6a-b, and 7a-b. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2a-b, 3a-b, 4a-b, 5a-b, 6a-b, and 7a-b. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2a-b, 3a-b, 4a-b, 5a-b, 6a-b, and 7a-b to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2a-b, 3a-b, 4a-b, 5a-b, 6a-b, and 7a-b. In one embodiment, design structure 990 may comprise a compiled, executable HDL simulation model that functionally simulates the devices shown in FIGS. 1, 2a-b, 3a-b, 4a-b, 5a-b, 6a-b, and 7a-b.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2a-b, 3a-b, 4a-b, 5a-b, 6a-b, and 7a-b. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a field effect transistor (FET) including a channel and a gate, wherein the gate comprises a crossbar structure and a leg structure extending orthogonal to the crossbar structure;
    forming a bar structure that is parallel to and offset from the crossbar structure; and
    forming a diode that is electrically connected between the channel and the gate, wherein the diode and channel are contained in a same layer of material.

2. The method of claim 1, further comprising:
    forming a source region of the FET in the layer of material; and
    forming a drain region of the FET in the layer of material.

3. The method of claim 1, wherein the forming the diode comprises:
    doping an anode region in the layer of material with p-type dopant;
    doping a cathode region in the layer of material with n-type dopant; and
    masking a region in the layer of material between the anode region and the cathode region.

4. The method of claim 3, further comprising doping a source region of the FET and a drain region of the FET simultaneously with the doping of the cathode region.

5. The method of claim 3, further comprising:
    masking the anode region during the doping of the cathode region; and
    masking the cathode region during the doping of the anode region.

6. The method of claim 3, wherein:
    the anode region is heavily doped with the p-type dopant;
    the cathode region is heavily doped with the n-type dopant; and
    the channel and the region between the anode region and the cathode region are lightly doped with the p-type dopant or a different p-type dopant.

7. The method of claim 3, further comprising:
    forming a first contact on and contacting the cathode region;
    forming a second contact on and contacting a top of the gate; and
    forming an interconnect extending between and contacting the first contact and the second contact.

8. The method of claim 1, wherein the bar structure, the crossbar structure, and the leg structure are formed over the layer of material.

9. A method of manufacturing a semiconductor structure, comprising:
    forming a p-doped island in a silicon-on-insulator wafer;
    forming a gate of a field effect transistor (FET) on the island, wherein the gate is formed with a crossbar and a leg;
    forming a bar on the island, wherein the bar is formed laterally offset from the crossbar;
    forming a p+ doped anode in the island between the bar and the crossbar;
    forming a n+ doped cathode in the island on a side of the bar opposite the crossbar; and
    forming contacts and an interconnect that electrically connect the cathode to the gate,
    wherein the anode and the cathode are parts of a p+/p/n+ diode that is electrically connected between a channel of the FET and the gate of the FET.

10. The method of claim 9, further comprising forming an n+ doped source and an n+ doped drain of the FET in the island.

11. The method of claim 9, wherein:
    the anode is formed adjacent a channel of the FET; and
    a region of the p-doped island remains between the anode and the cathode.

12. A semiconductor structure, comprising:
    a substrate;
    a buried insulator layer on the substrate;
    a layer of semiconductor material on the buried insulator layer;
    a field effect transistor (FET) including a gate on the layer of semiconductor material and a channel in the layer of semiconductor material;
    a diode in the layer of semiconductor material; and
    contacts and an interconnect that electrically connect the diode to the gate,
    wherein the gate comprises:
        a crossbar structure over the layer of semiconductor material; and a leg structure over the layer of semiconductor material and extending orthogonally from the crossbar structure.

13. The semiconductor structure of claim 12, wherein the diode comprises:
   a p+ doped cathode in the layer of semiconductor material;
   a p-doped region in the layer of semiconductor material; and
   an n+ doped anode in the layer of semiconductor material.

14. The semiconductor structure of claim 13, wherein:
   the channel is in another p-doped region in the layer of semiconductor material;
   the anode is adjacent to the channel; and
   the p-doped region of the layer of semiconductor material is between the anode and the cathode.

15. The semiconductor structure of claim 13, further comprising:
   an n+ doped source of the FET in the layer of semiconductor material; and
   an n+ doped drain of the FET in the layer of semiconductor material.

16. The semiconductor structure of claim 12, wherein the diode comprises a p+/p/n+ junction in the layer of semiconductor material.

17. The semiconductor structure of claim 12, further comprising a bar structure over the layer of semiconductor material, wherein:
   the bar structure is laterally offset from the crossbar structure;
   a p+ doped region of the diode is in the layer of semiconductor material between the bar structure and the crossbar structure;
   a p-doped region of the diode is in the layer of semiconductor material under the bar structure; and
   an n+ doped region of the diode is in the layer of semiconductor material on a side of the bar structure opposite the crossbar structure.

18. The semiconductor structure of claim 12, wherein the contacts comprise:
   a first contact on and contacting a cathode of the diode; and
   a second contact on and contacting the gate.

19. The semiconductor structure of claim 12, wherein the diode and the channel are formed by separate regions in the layer of semiconductor material.

* * * * *